United States Patent
Kim et al.

(10) Patent No.: US 11,211,591 B2
(45) Date of Patent: Dec. 28, 2021

(54) ORGANIC LIGHT-EMITTING DISPLAY DEVICE HAVING AN ENCAPSULATING SUBSTRATE OF HIGH THERMAL CONDUCTIVITY

(71) Applicant: LG Display Co., Ltd., Seoul (KR)

(72) Inventors: Jung-Mook Kim, Goyang-si (KR); Young-Hoon Shin, Paju-si (KR)

(73) Assignee: LG Display Co., Ltd., Seoul (KR)

(*) Notice: Subject to any disclaimer, the term of this patent is extended or adjusted under 35 U.S.C. 154(b) by 87 days.

(21) Appl. No.: 16/134,057

(22) Filed: Sep. 18, 2018

(65) Prior Publication Data

US 2019/0103579 A1 Apr. 4, 2019

(30) Foreign Application Priority Data

Sep. 29, 2017 (KR) .................. 10-2017-0127392

(51) Int. Cl.
*H01L 51/52* (2006.01)
*H01L 27/32* (2006.01)

(52) U.S. Cl.
CPC ........ *H01L 51/529* (2013.01); *H01L 27/3244* (2013.01); *H01L 51/5243* (2013.01);
(Continued)

(58) Field of Classification Search
CPC ............. H01L 51/5253; H01L 27/3244; H01L 51/529; H01L 51/5237; H01L 51/524;
(Continued)

(56) References Cited

U.S. PATENT DOCUMENTS

2002/0125822 A1* 9/2002 Graff .................. H01M 50/183
313/506
2011/0175102 A1* 7/2011 Hatano ............... H01L 27/1266
257/72

(Continued)

FOREIGN PATENT DOCUMENTS

CN 102860128 A 1/2013
CN 103855322 A 6/2014
(Continued)

OTHER PUBLICATIONS

Notice of Reasons for Rejection dated Aug. 6, 2019, issued in corresponding Japanese Patent Application No. 2018-175535.
(Continued)

*Primary Examiner* — Jesse Y Miyoshi
(74) *Attorney, Agent, or Firm* — Morgan, Lewis & Bockius LLP

(57) ABSTRACT

An organic light-emitting display device including an encapsulating layer covering a light-emitting element and an encapsulating substrate on the encapsulating layer is provided. The organic light-emitting display device may include metal particles which are dispersed on an outer surface of the encapsulating substrate having a high thermal conductivity, so that damage of the light-emitting element due to external impact may be prevented. And, the organic light-emitting display device may include a capping layer covering the metal particles, so that the surface roughness due to the metal particles may be reduced.

16 Claims, 2 Drawing Sheets

(52) U.S. Cl.
CPC ........ *H01L 51/5246* (2013.01); *H01L 27/322* (2013.01); *H01L 51/5253* (2013.01); *H01L 51/5259* (2013.01); *H01L 2251/5369* (2013.01)

(58) Field of Classification Search
CPC ............. H01L 51/5243; H01L 51/5246; H01L 51/525; H01L 51/5256; H01L 51/5259; H01L 51/0097; H01L 2251/5338
See application file for complete search history.

(56) References Cited

U.S. PATENT DOCUMENTS

| | | |
|---|---|---|
| 2013/0093308 A1 | 4/2013 | Kagotani et al. |
| 2014/0151655 A1 | 6/2014 | Ahn et al. |
| 2014/0374726 A1 | 12/2014 | Goeoetz et al. |
| 2015/0076460 A1* | 3/2015 | Kim .................... H01L 51/0096 |
| | | 257/40 |
| 2016/0155966 A1 | 6/2016 | Kim |
| 2016/0359134 A1 | 12/2016 | Park et al. |
| 2017/0040570 A1* | 2/2017 | Kim ......................... H01L 51/56 |
| 2017/0125729 A1 | 5/2017 | Kim |
| 2018/0047920 A1* | 2/2018 | Jang ........................ B32B 5/145 |

FOREIGN PATENT DOCUMENTS

| | | |
|---|---|---|
| CN | 104054191 A | 9/2014 |
| CN | 105655371 A | 6/2016 |
| CN | 105848882 A | 8/2016 |
| CN | 106653795 A | 5/2017 |
| JP | 2000-040586 A | 2/2000 |

OTHER PUBLICATIONS

The First Office Action dated Jun. 3, 2020, issued in corresponding Chinese Patent Application No. 201811114993.X.

* cited by examiner

ORGANIC LIGHT-EMITTING DISPLAY DEVICE HAVING AN ENCAPSULATING SUBSTRATE OF HIGH THERMAL CONDUCTIVITY

This application claims the priority benefit of Korean Patent Application No. 10-2017-0127392, filed on Sep. 29, 2017, which is hereby incorporated by reference as if fully set forth herein.

BACKGROUND

Technical Field

The present disclosure relates to an organic light-emitting display device including an encapsulating substrate having a high thermal conductivity to rapidly emit heat generated in a light-emitting element and/or a driving circuit to the outside.

Discussion of the Related Art

Generally, an electronic appliance, such as a monitor, a TV, a laptop computer and a digital camera, include a display device to realize an image. For example, the display device may include a liquid crystal display device and/or an organic light-emitting display device.

The organic light-emitting display device may include a light-emitting element. The light-emitting element may generate light realizing a specific color. For example, the light-emitting element may include a first electrode, a light-emitting layer and a second electrode, which are sequentially stacked.

The organic light-emitting display device may present external moisture from permeating to the light-emitting element. For example, the organic light-emitting display device may include an encapsulating layer covering the light-emitting element, and an encapsulating substrate disposed on the encapsulating layer.

The light-emitting element and a driving circuit controlling the light-emitting element may generate heat during an operation of realizing an image. The light-emitting layer may be very vulnerable to heat. Thus, the organic light-emitting display device must rapidly emit heat generated in the light-emitting element and/or the driving circuit to the outside. For example, the organic light-emitting display device may include the encapsulating substrate formed of a material having a relatively high thermal conductivity, such as aluminum (Al).

However, since the material having a high thermal conductivity may have a relatively low rigidity, the light-emitting element of the organic light-emitting display device may be damaged by an external impact. In order to prevent damage of the light-emitting element due to the external impact, the organic light-emitting display device may increase a thickness of the encapsulating substrate or add additional layer for reinforcing rigidity on the encapsulating substrate, but the overall thickness of the organic light-emitting display device may be increased.

SUMMARY

Accordingly, embodiments of the present invention are directed to an organic light-emitting display device that substantially obviates one or more problems due to limitations and disadvantages of the related art.

An aspect of the present disclosure is to provide an organic light-emitting display device capable of having high heat radiation efficiency, and preventing damage of a light-emitting element due to an external impact.

Another aspect of the present disclosure is to provide an organic light-emitting display device capable of complementing the rigidity of an encapsulating substrate with minimizing the increase of the overall thickness.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these objects and other aspects of the inventive concepts, as embodied and broadly described herein, an organic light-emitting display device comprises a light-emitting element on a device substrate. An encapsulating layer is disposed on the light-emitting element. An encapsulating substrate is disposed on the encapsulating layer. A metal coating layer is disposed on the encapsulating substrate. The metal coating layer includes metal particles dispersed on an outer surface of the encapsulating substrate. A capping layer is disposed on the metal coating layer.

A surface of the capping layer opposite to the encapsulating substrate may be a flat surface.

The metal particles may be a magnetic material.

The magnetic material may be one of iron (Fe), nickel (Ni) and cobalt (Co).

The capping layer may be extended on a side surface of the encapsulating substrate.

The capping layer may include a region being in direct contact with the side surface of the encapsulating substrate.

The capping layer may include an organic insulating material.

The encapsulating substrate may include aluminum.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
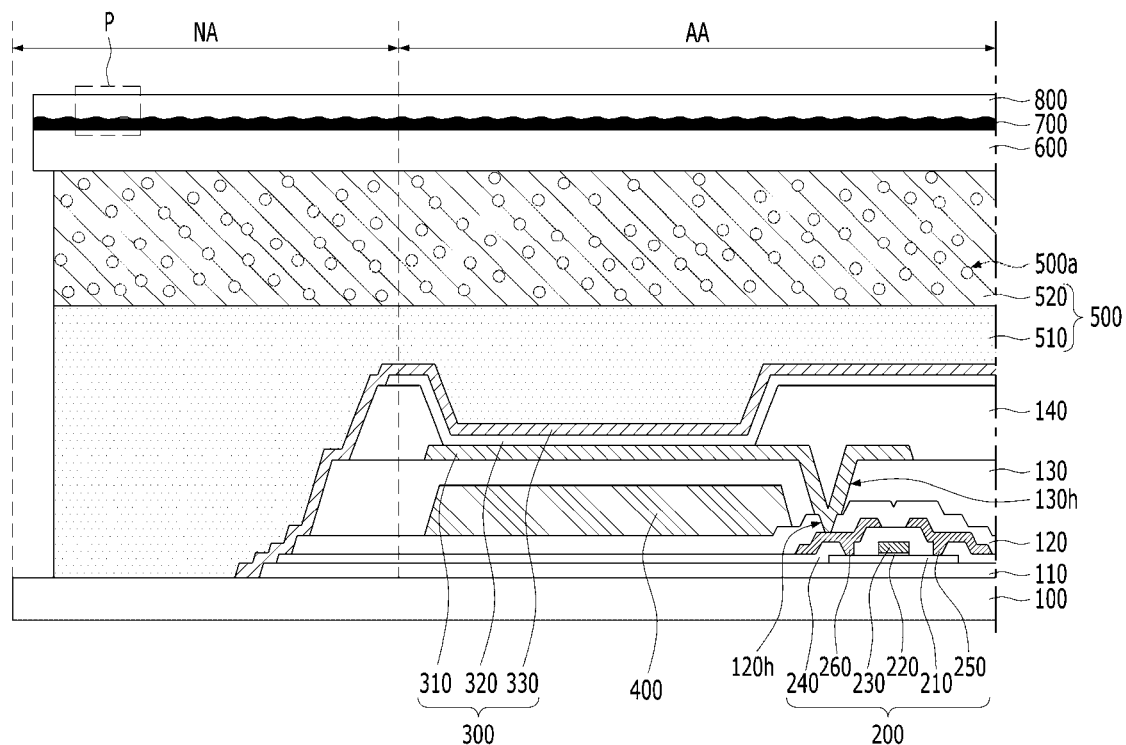
FIG. 1 is a view schematically showing an organic light-emitting display device according to an embodiment of the present invention.

Hereinafter, details related to the above objects, technical configurations, and operational effects of the embodiments of the present invention will be clearly understood by the following detailed description with reference to the drawings, which illustrate some embodiments of the present invention. Here, the embodiments of the present invention are provided in order to allow the technical spirit of the present invention to be satisfactorily transferred to those skilled in the art, and thus the present invention may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical spirit of the present invention.

The terms used in the specification of the present invention are merely used in order to describe particular embodiments, and are not intended to limit the scope of the present invention. For example, an element described in the singular form is intended to include a plurality of elements unless the context clearly indicates otherwise. In addition, in the specification of the present invention, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 2:
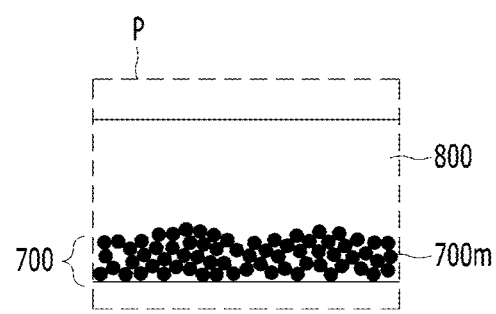
FIG. 2 is an enlarged view of P region in FIG. 1.

FIG. 1 is a view schematically showing an organic light-emitting display device according to an embodiment of the present invention. FIG. 2 is an enlarged view of P region in FIG. 1.

Referring to FIGS. 1 and 2, the organic light-emitting display device according to the embodiment of the present invention may include a device substrate 100. The device substrate 100 may include an insulating material. The device substrate 100 may include a transparent material. For example, the device substrate 100 may include glass or plastic.

The device substrate 100 may include a display area AA and a non-display area NA. The non-display area NA may be disposed outside the display area AA. For example, the non-display area NA may include an edge of the device substrate 100.

A thin film transistor 200 may be disposed on the display area AA of the device substrate 100. For example, the thin film transistor 200 may include a semiconductor pattern 210, a gate insulating layer 220, a gate electrode 230, an interlayer insulating layer 240, a source electrode 250 and a drain electrode 260.

The semiconductor pattern 210 may be disposed close to the device substrate 100. The semiconductor pattern 210 may include a semiconductor material. For example, the semiconductor pattern 210 may include amorphous silicon or poly-silicon. The semiconductor pattern 210 may be an oxide semiconductor. For example, the semiconductor pattern 210 may include IGZO.

The semiconductor pattern 210 may include a source region, a drain region and a channel region. The channel region may be disposed between the source region and the drain region. The conductivity of the channel region may be lower than the conductivities of the source region and the drain region. For example, the source region and the drain region may include a conductive impurity.

The gate insulating layer 220 may be disposed on the semiconductor pattern 210. A size of the gate insulating layer 220 may be smaller than a size of the semiconductor pattern 210. For example, the gate insulating layer 220 may overlap with the channel region of the semiconductor pattern 210.

The gate insulating layer 220 may include an insulating material. For example, the gate insulating layer 220 may include silicon oxide and/or silicon nitride. The gate insulating layer 220 may include a high-K material. For example, the gate insulating layer 220 may include hafnium oxide (HfO) or titanium oxide (TiO). The gate insulating layer 220 may have a multi-layer structure.

The gate electrode 230 may be disposed on the gate insulating layer 220. For example, the gate electrode 230 may overlap the channel region of the semiconductor pattern 210. The gate electrode 230 may be insulated from the semiconductor pattern 210 by the gate insulating layer 220. For example, a side surface of the gate electrode 230 may be vertically aligned with a side surface of the gate insulating layer 220.

The gate electrode 230 may include a conductive material. For example, the gate electrode 230 may include a metal, such as aluminum (Al), chrome (Cr), molybdenum (Mo) and tungsten (W).

The interlayer insulating layer 240 may be disposed on the semiconductor pattern 210 and the gate electrode 230. The interlayer insulating layer 240 may be extended beyond the semiconductor pattern 210. For example, a side surface of the semiconductor pattern 210 may be covered by the interlayer insulating layer 240.

The interlayer insulating layer 240 may include an insulating material. For example, the interlayer insulating layer 240 may include silicon oxide.

The source electrode 250 may be disposed on the interlayer insulating layer 240. The source electrode 250 may be electrically connected to the source region of the semiconductor pattern 210. For example, the source electrode 250 may overlap with the source region of the semiconductor pattern 210. The interlayer insulating layer 240 may include a contact hole partially exposing the source region of the semiconductor pattern 210.

The source electrode 250 may include a conductor material. For example, the source electrode 250 may include a metal, such as aluminum (Al), chrome (Cr), molybdenum (Mo) and tungsten (W). The source electrode 250 may include a material different from the gate electrode 230.

The drain electrode 260 may be disposed on the interlayer insulating layer 240. The drain electrode 260 may be electrically connected to the drain region of the semiconductor pattern 210. The drain electrode 260 may be spaced away from the source electrode 250. For example, the drain electrode 250 may overlap with the drain region of the semiconductor pattern 210. The interlayer insulating layer 240 may further include a contact hole partially exposing the drain region of the semiconductor pattern 210.

The drain electrode 260 may include a conductive material. For example, the drain electrode 260 may include a metal, such as aluminum (Al), chrome (Cr), molybdenum (Mo) and tungsten (W). The drain electrode 260 may include a material different from the gate electrode 230. The drain electrode 260 may include a material same as the source electrode 250.

A buffer layer 110 may be disposed between the device substrate 100 and the thin film transistor 200. For example, the buffer layer 110 may be disposed between the device substrate 100 and the semiconductor pattern 210. The buffer layer 110 may include an insulating material. For example, the buffer layer 110 may include silicon oxide.

A lower passivation layer 120 may be disposed on the thin film transistor 200. The lower passivation layer 120 may prevent damage of the thin film transistor 200 due to external impact and moisture. For example, the lower passivation layer 120 may be extended beyond the source electrode 250 and the drain electrode 260. The lower passivation layer 120 may be in direct contact with the interlayer insulating layer 240 at the outside of the source electrode 250 and the drain electrode 260. The lower passivation layer 120 may include an insulating material. The lower passivation layer 120 may include a material different from the interlayer insulating layer 240. For example, the lower passivation layer 120 may include silicon nitride.

An over-coat layer 130 may be disposed on the lower passivation layer 120. The over-coat layer 130 may remove a thickness difference due to the thin film transistor 200. For example, an upper surface of the over-coat layer 130 opposite to the device substrate 100 may be a flat surface.

The over-coat layer 130 may include an insulating material. The over-coat layer 130 may include a material different from the lower passivation layer 120. The over-coat layer 130 may include a material having a relatively high fluidity. For example, the over-coat layer 130 may include an organic insulating material.

A light-emitting element 300 may be disposed on the over-coat layer 130. The light-emitting element 300 may generate light realizing a specific color. For example, the light-emitting element 300 may include a first electrode 310, a light-emitting layer 320 and a second electrode 330, which are sequentially stacked.

The first electrode 310 may be disposed close to the over-coat layer 130. The light-emitting element 300 may be controlled by the thin film transistor 200. For example, the first electrode 310 may be electrically connected to the drain electrode 260 of the thin film transistor 200. For example, the lower passivation layer 120 may include a lower contact hole 120h exposing at least portion of the drain electrode 260. The over-coat layer 130 may include an upper contact hole 130h overlapping with the lower contact hole 120h. The first electrode 310 may be extended along a side wall of the lower contact hole 120h and a side wall of the upper contact hole 130h.

The first electrode 310 may include a conductive material. The first electrode 310 may include a transparent material. For example, the first electrode 310 may be a transparent electrode formed of a transparent material, such as ITO and IZO.

The light-emitting layer 320 may generate light having luminance corresponding to a voltage difference between the first electrode 310 and the second electrode 330. For example, the light-emitting layer 320 may include an emitting material layer (EML) having an emission material. The emission material may be an organic material.

The light-emitting layer 320 may have a multi-layer structure in order to increase luminous efficiency. For example, the light-emitting layer 320 may further include at least one of a hole injection layer (HIL), a hole transporting layer (HTL), an electron transporting layer (ETL) and an electron injection layer (EIL).

The second electrode 330 may include a conductive material. The second electrode 330 may include a material different from the first electrode 310. For example, the second electrode 330 may include a metal having a high reflectance, such as aluminum (Al). Thus, in the organic light-emitting display device according to the embodiment of the present invention, the light generated by the light-emitting layer 320 may be emitted to the outside through the device substrate 100.

In the organic light-emitting display device according to the embodiment of the present invention, a plurality of light-emitting elements 300 may be disposed on the device substrate 100. Each of the light-emitting elements 300 may be driven, independently. For example, the first electrode 310 of each light-emitting element 300 may be separated from the first electrodes 210 of adjacent light-emitting elements 300. A bank insulating layer 140 may be disposed between the first electrodes 310 of adjacent light-emitting elements 300. The bank insulating layer 140 may cover an edge of the first electrode 310. The light-emitting layer 320 and the second electrode 330 may be disposed on a portion of the first electrode 310 exposed by the bank insulating layer 140.

The bank insulating layer 140 may include an insulating material. For example, the bank insulating layer 140 may include an organic insulating material. The bank insulating layer 140 may include a material different from the over-coat layer 130.

The portion of the first electrode 310 exposed by the bank insulating layer 140 may be spaced away from the thin film transistor 200. For example, the bank insulating layer 140 may overlap the thin film transistor 200. Thus, in the organic light-emitting display device according to the embodiment of the present invention, the light traveling toward the device substrate 100 from the light-emitting element 300 may be not blocked by the thin film transistor 200.

The second electrode 330 may be extended on the bank insulating layer 140. For example, the second electrode 330 may be extended on a side surface of the bank insulating layer 140, a side surface of the over-coat layer 130, and a side surface of the lower passivation layer 120, which are disposed close to the non-display area NA of the device substrate 100. Thus, the organic light-emitting display device according to the embodiment of the present invention may prevent the permeation of the external moisture through the insulating layers stacked between the device substrate 100 and the second electrode 330, and a boundary between adjacent insulating layers.

A color filter 400 may be disposed between the device substrate 100 and the light-emitting element 300. For example, the color filter 400 may be disposed between the lower passivation layer 120 and the over-coat layer 130. The thickness difference due to the color filter 400 may be removed by the over-coat layer 130. The color filter 400 may change a color realized by the light which is emitted from the light-emitting element 300. For example, the light-emitting layer 320 may generate light realizing white color, and the color filter 400 may realize blue color, red color or green color using the light generated by the light-emitting layer 320. The color filter 400 may have a horizontal width larger than the portion of the first electrode 310 which is exposed by the bank insulating layer 140. Thus, in the organic light-emitting display device according to the embodiment of the present invention, light leakage may be prevented.

An encapsulating layer 500 may be disposed on the light-emitting element 300. The encapsulating layer 500 may prevent damage of the light-emitting element 300 due to the external impact and moisture. The encapsulating layer 500 may be extended on the non-display area NA of the device substrate 100. For example, the light-emitting element 300 may be covered by the encapsulating layer 500, completely.

The encapsulating layer 500 may have a multi-layer structure. For example, the encapsulating layer 500 may include a lower encapsulating layer 510 and an upper encapsulating layer 520 disposed on the lower encapsulating layer 510. The light-emitting element 300 may be covered by the lower encapsulating layer 510. The upper encapsulating layer 520 may include moisture-absorbing particles 500p. The moisture-absorbing particles 500p may include a moisture-absorbing material. Thus, in the organic light-emitting display device according to the embodiment of the present invention, the stress applied to the light-emitting element 300 due to the expansion of the moisture-absorbing particles 500p may be relieved by the lower encapsulating layer 510.

The lower encapsulating layer 510 and the upper encapsulating layer 520 may include an insulating material. The lower encapsulating layer 510 and the upper encapsulating layer 520 may include an adhesive material. The lower encapsulating layer 510 and the upper encapsulating layer 520 may include a material which does not require a curing process. For example, the lower encapsulating layer 510 and the upper encapsulating layer 520 may include an olefin-based material. Thus, in the organic light-emitting display device according to the embodiment of the present invention, the degradation of the light-emitting layer 320 due to a process of forming the lower encapsulating layer 510 and the upper encapsulating layer 520 may be prevented. The upper encapsulating layer 520 may include a material different from the lower encapsulating layer 510. Therefore, in the organic light-emitting display device according to the embodiment of the present invention, the relief of the stress by the lower encapsulating layer 510 may be performed, efficiently.

The organic light-emitting display device according to the embodiment of the present invention is described that the encapsulating layer 500 is in direct contact with the light-emitting element 300. However, the organic light-emitting display device according to another embodiment of the present invention may further include an upper passivation layer disposed between the light-emitting element 300 and the lower encapsulating layer 510. The upper passivation layer may prevent the damage of the light-emitting element 300 due to the external impact and moisture. The upper passivation layer may include an insulating material. The upper passivation layer may have multi-layer structure. For example, the upper passivation may have a structure in which an organic layer formed of an organic insulating material is disposed between inorganic layers formed of an inorganic insulating material.

An encapsulating substrate 600 may be disposed on the encapsulating layer 500. The encapsulating substrate 600 may be in direct contact with the encapsulating layer 500. Thus, in the organic light-emitting display device according to the embodiment of the present invention, the encapsulating substrate 600 may be coupled to the device substrate 100 on which the thin film transistor 200 and the light-emitting element 300 are formed, by the encapsulating layer 500.

The encapsulating substrate 600 may overlap the display area AA and the non-display area NA of the device substrate 100. A size of the encapsulating substrate 600 may be larger than a size of the encapsulating layer 500. For example, a lower surface of the encapsulating substrate 600 facing the device substrate 100 may include an edge exposed by the encapsulating layer 500. Thus, in the organic light-emitting display device according to the embodiment of the present invention, the defect due to misalignment of the upper encapsulating layer 520 may be prevented. The size of the encapsulating substrate 600 may be smaller than a size of the device substrate 100. For example, a side surface of the encapsulating substrate 600 may be disposed between a side surface of the device substrate 100 and a side surface of the encapsulating layer 500.

The encapsulating substrate 600 may include a material different from the device substrate 100. The encapsulating substrate 600 may provide the radiation path of heat generated in the light-emitting element 300 and/or the thin film transistor 200 during an operation of realizing an image. For example, the encapsulating substrate 600 may include a metal having a relatively high thermal conductivity, such as aluminum (Al).

A metal coating layer 700 may be disposed on an outer surface of the encapsulating substrate 600 opposite to the encapsulating layer 500. The metal coating layer 700 may include metal particles 700m dispersed on the outer surface of the encapsulating substrate 600. That is, in the organic light-emitting display device according to the embodiment of the present invention, the outer surface of the encapsulating substrate 600 may be coated by the metal particles 700m. Thus, in the organic light-emitting display device according to the embodiment of the present invention, the rigidity of the encapsulating substrate 600 may be compensated with minimizing the increase of the overall thickness. The encapsulating substrate 600 including the outer surface coated by the metal particles 700m may be harder than a structure in which an additional compensating layer is formed on the encapsulating substrate 600. Also, the metal particles 700m dispersed on the outer surface of the encapsulating substrate 600 may have a thermal conductivity higher than the additional compensating layer formed on the encapsulating substrate 600. Therefore, in the organic light-emitting display device according to the embodiment of the present invention, the damage of the light-emitting element 300 due to the external impact may be prevented with minimizing the degree of reducing the thermal conductivity of the encapsulating substrate 600. Thereby, in the organic light-emitting display device according to the embodiment of the present invention, the heat radiation efficiency and the reliability may be improved.

A capping layer 800 may be disposed on the metal coating layer 700. The capping layer 800 may include an insulating material. The capping layer 800 may cover the metal particles 700m. For example, the capping layer may include an organic insulating material having a relatively high fluidity. For example, the capping layer 800 may include the same material as the over-coat layer 130. A surface of the capping layer 800 opposite to the encapsulating substrate 600 may be a flat surface. For example, the surface of the capping layer 800 may be parallel with the outer surface of the encapsulating substrate 600. Since the capping layer 800 includes a material having a high fluidity, a space between the metal particles 700m may be filled by the capping layer 800. The capping layer 800 may include an adhesive material. For example, the capping layer 800 may include a material same as the lower encapsulating layer 510. The capping layer 800 may include an olefin-based material. Thus, in the organic light-emitting display device according to the embodiment of the present invention, the surface roughness due to the metal particles 700m may be reduced. Therefore, in the organic light-emitting display device according to the embodiment of the present invention, damage due to a rough surface may be prevented.

The metal particles 700m may include a magnetic material. For example, the metal particles 700m may include a ferromagnetic material, such as iron (Fe), nickel (Ni) and cobalt (Co). Thus, in the organic light-emitting display device according to the embodiment of the present invention, the encapsulating substrate 600 may be moved by jig including a magnetic plate. That is, in the organic light-emitting display device according to the embodiment of the present invention, the location of the encapsulating substrate 600 may be easily adjusted during a process of coupling the device substrate 100 and the encapsulating substrate 600. And, in the organic light-emitting display device according to the embodiment of the present invention, the surface roughness may be reduced by the capping layer 800, so that damage of the encapsulating substrate 600 and/or the device substrate 100 due to a process of attaching or detaching the encapsulating substrate 600 by the transfer jig, may be prevented. Also, in the organic light-emitting display device according to the embodiment of the present invention, the process of attaching or detaching the encapsulating substrate 600 to the transfer jig may be simplified, so that the process time for coupling the device substrate 100 and the encapsulating substrate 600 may be reduced. Therefore, in the organic light-emitting display device according to the embodiment of the present invention, the damage of the light-emitting element 300 due to the external impact may be prevented with the increase of the process efficiency.

Accordingly, the organic light-emitting display device according to the embodiment of the present invention may including a metal coating layer 700 including metal particles 700m and a capping layer 800 covering the metal particles 700m which are sequentially stacked on the outer surface of the encapsulating substrate 600 having a high thermal conductivity, so that the rigidity of the encapsulating substrate 600 may be compensated with minimizing the increase of the overall thickness and the degradation of the thermal conductivity efficiency. Also, in the organic light-emitting display device according to the embodiment of the present invention, the process efficiency may be improved by the metal particles 700m having a magnetic material and the capping layer 800. Thus, in the organic light-emitting display device according to the embodiment of the present invention, the heat radiation efficiency, the process efficiency and the reliability may be increased.

Figure 3:
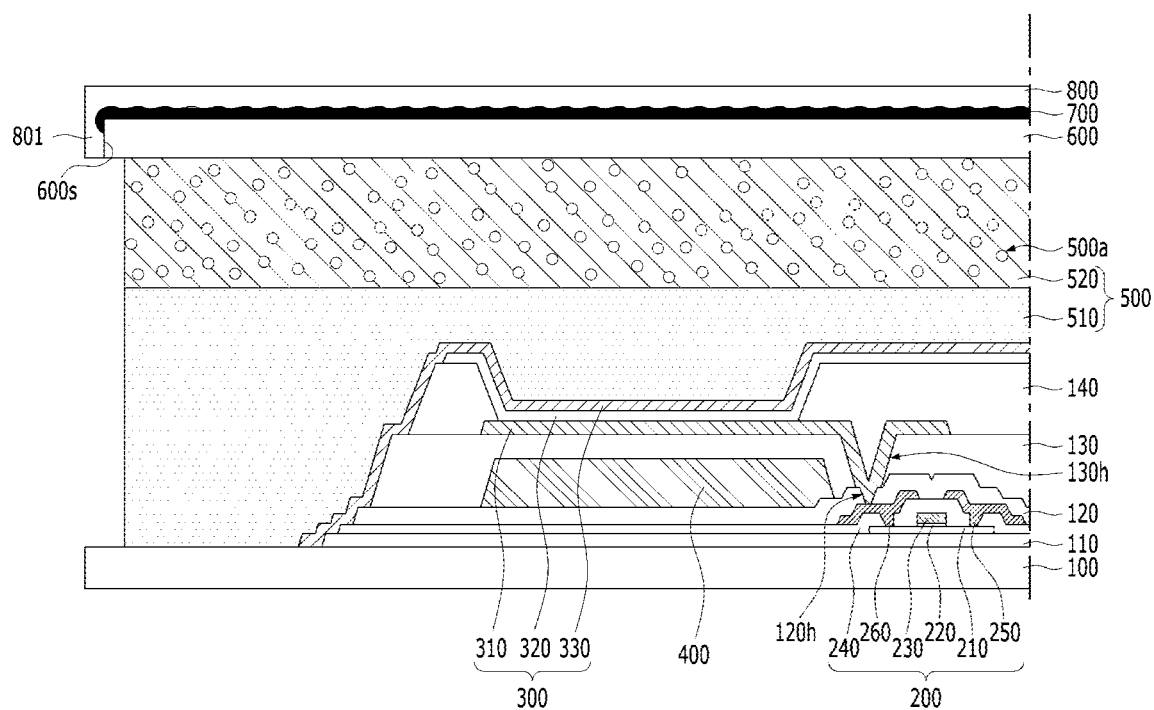
FIG. 3 is a view showing the organic light-emitting display device according to another embodiment of the present invention.

The organic light-emitting display device according to the embodiment of the present invention is described that the capping layer 800 is only disposed on the outer surface of the encapsulating substrate 600. However, in the organic light-emitting display device according to another embodiment of the present invention, the capping layer 800 may be extended on a side surface 600s of the encapsulating substrate 600, as shown in FIG. 3. For example, the capping layer 800 may include a region 801 being in direct contact with the side surface 600s of the encapsulating substrate 600. Thus, in the organic light-emitting display device according to another embodiment of the present invention, the metal particles may be dispersed on the side surface 600s of the encapsulating substrate 600, partially. That is, in the organic light-emitting display device according to another embodiment of the present invention, the process margin for dispersing the metal particles on the outer surface of the encapsulating substrate 600 may be increased. Thereby, in the organic light-emitting display device according to another embodiment of the present invention, the heat radiation efficiency, the process efficiency and the reliability may be increased, efficiently.

In the result, the organic light-emitting display device according to the embodiments of the present invention may include a metal coating layer including metal particles dispersed on an outer surface of an encapsulating substrate, and a capping layer on the metal coating layer. Thus, in the organic light-emitting display device according to the embodiments of the present invention, the rigidity of the encapsulating substrate having a high thermal conductivity may be increase by the metal particles. And, in the organic light-emitting display device according to the embodiments of the present invention, the surface roughness due to the metal particles may be reduced by the capping layer. Therefore, in the organic light-emitting display device according to the embodiments of the present invention, the heat radiation efficiency and the reliability may be improved.

It will be apparent to those skilled in the art that various modifications and variations can be made in the organic light-emitting display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light-emitting display device, comprising:
   a light-emitting element between a device substrate and an encapsulating substrate;
   an encapsulating layer between the light-emitting element and the encapsulating substrate;
   a metal coating layer including metal particles which are dispersed on an outer surface of the encapsulating substrate and on a side surface of the encapsulating substrate; and
   a capping layer covering the metal particles, the capping layer extended on the side surface of the encapsulating substrate,
   wherein the capping layer includes a region being in direct contact with the side surface of the encapsulating substrate.

2. The organic light-emitting display device according to claim 1, wherein a surface of the capping layer opposite to the encapsulating substrate is a flat surface.

3. The organic light-emitting display device according to claim 1, wherein the metal particles include a magnetic material.

4. The organic light-emitting display device according to claim 3, wherein the magnetic material includes one of iron (Fe), Nickel (Ni) and cobalt (Co).

5. The organic light-emitting display device according to claim 1, wherein the capping layer includes an organic insulating material.

6. The organic light-emitting display device according to claim 1, wherein the encapsulating substrate includes aluminum.

7. The display device according to claim 1, wherein the encapsulating layer includes an upper encapsulating layer having a moisture-absorbing material, and a lower encapsulating layer between the light-emitting element and the upper encapsulating layer.

8. The display device according to claim 7, wherein the lower encapsulating layer and the upper encapsulating layer include an adhesive material.

9. The display device according to claim 7, wherein the upper encapsulating layer includes a material different from the lower encapsulating layer.

10. A display device, comprising:
a light-emitting element on a device substrate;
a lower encapsulating layer on the light-emitting element;
an encapsulating substrate on the lower encapsulating layer;
metal particles stacked on an outer surface and a side surface of the encapsulating substrate, the outer surface and the side surface of the encapsulating substrate being coated by the metal particles, such that the lowest layer of the metal particles being in direct contact with the encapsulating substrate; and
a capping layer covering the metal particles,
wherein a space between the metal particles is filled by the capping layer, and
wherein the capping layer includes a region being in direct contact with the side surface of the encapsulating substrate.

11. The display device according to claim 10, wherein the capping layer is in contact with the outer surface of the encapsulating substrate between the metal particles.

12. The display device according to claim 10, further comprising an upper encapsulating layer between the lower encapsulating layer and the encapsulating substrate, the upper encapsulating layer including a moisture-absorbing material.

13. The display device according to claim 12, wherein the lower encapsulating layer and the upper encapsulating layer include an adhesive material.

14. The display device according to claim 12, wherein the upper encapsulating layer includes a material different from the lower encapsulating layer.

15. The display device according to claim 10, wherein a surface of the capping layer opposite to the encapsulating substrate is parallel with the outer surface of the encapsulating substrate.

16. The display device according to claim 10, wherein the metal particles include a ferromagnetic material.

* * * * *